United States Patent [19]

Higuchi

[11] Patent Number: 5,014,109

[45] Date of Patent: May 7, 1991

[54] MINIATURIZATION OF A CONTACT HOLE IN A SEMICONDUCTOR DEVICE

[75] Inventor: Takayoshi Higuchi, Sendai, Japan

[73] Assignee: Kabushiki Kaisha Toshiba, Kawasaki, Japan

[21] Appl. No.: 388,037

[22] Filed: Aug. 1, 1989

[30] Foreign Application Priority Data

Aug. 5, 1988 [JP] Japan ................... 63-194572

[51] Int. Cl.[5] ............... H01L 23/48; H01L 29/44; H01L 29/52; H01L 29/62
[52] U.S. Cl. ........................ 357/68; 357/65; 357/71
[58] Field of Search .............. 357/68, 65, 71

[56] References Cited

U.S. PATENT DOCUMENTS

| | | | |
|---|---|---|---|
| 4,484,209 | 11/1984 | Uchida | 357/23 |
| 4,523,216 | 6/1985 | Shiotari | 357/42 |
| 4,617,193 | 10/1986 | Wu | 427/38 |
| 4,722,910 | 2/1988 | Yasaitis | 437/44 |
| 4,737,831 | 4/1988 | Iwai | 357/23.9 |
| 4,772,567 | 9/1988 | Hirao | 437/33 |
| 4,853,894 | 8/1989 | Yamanaka et al. | 365/154 |

OTHER PUBLICATIONS

IBM Technical Disclosure Bulletin, vol. 20, No. 1, Jun. 1977, J. A. Bialko et al., "Reducing Interlevel Shorts in Sputtered Insulators".

IBM Technical Disclosure Bulletin, vol. 25, No. 9, Feb. 1983, C. G. Jambotkar, "Method to Realize Submicrometer-Wide Images".

*Primary Examiner*—Rolf Hille
*Assistant Examiner*—David Ostrowski
*Attorney, Agent, or Firm*—Finnegan, Henderson, Henderson, Farabow, Garrett and Dunner

[57] ABSTRACT

The present invention provides a semiconductor device, comprising a substrate, a first insulation layer formed on the substrate, a first wiring layer formed on the first insulation layer, a second insulation layer formed on the first wiring layer and having a contact hole, and a third insulation layer formed on the second insulation layer, said third insulation layer being in contact with the first wiring layer via the contact hole.

10 Claims, 2 Drawing Sheets

MINIATURIZATION OF A CONTACT HOLE IN A SEMICONDUCTOR DEVICE

BACKGROUND OF THE INVENTION

1. Field of the Invention

The present invention relates to a semiconductor device and a method of manufacturing the same, particularly, to a method of connecting multi-layered wiring layers.

2. Description of the Related Art

In a semiconductor device using multi-wiring layers, connection of wiring layers is performed in general by making contact holes in an interlayer insulation layer. FIGS. 3A and 3B collectively show an example of the conventional contact structure of a MOS type semiconductor device for connecting a first wiring layer formed of polycrystalline silicon, said first wiring layer providing a gate electrode, to a second wiring layer formed of a metal.

As seen from FIG. 3A, which is a cross sectional view along the channel region of the MOS transistor, a field oxide layer 2 is selectively formed on the surface of a p-type silicon substrate 1 such that the element region of the MOS transistor is surrounded by the field oxide layer 2. As seen from FIG. 3B, which is a plan view, $N^+$-type source and drain regions 3 and 4 are formed apart from each other within the element region with the channel region positioned therebetween. A gate electrode 6 formed of polycrystalline silicon is formed above the channel region with a gate oxide layer 5 interposed therebetween. The gate electrode 6 extends to cover partly the field oxide layer 2 and is covered with an interlayer insulation layer 7 formed of silicon dioxide by CVD. Further, an aluminum wiring layer is formed on the interlayer insulation layer 7. A contact hole 8 is formed in the interlayer insulation layer 7 for bringing the aluminum wiring layer into contact with the gate electrode 6. A reactive ion etching (RIE) is employed for forming the contact hole 8 in accordance with miniaturization of the element. In this case, it is necessary to provide an allowance A in the contact portion of the gate electrode 6 as shown in FIG. 3B in view of the deviation in the mask alignment in the step of PEP (photoetcing process) for forming the contact hole. Naturally, the allowance A inhibits miniaturization of the semiconductor device.

Where the allowance A is not provided, it is possible for the contact hole 8 to extend beyond the gate electrode 6 because of the deviation in the mask alignment, as shown in FIG. 4. In this case, the field oxide layer 2 is also etched in the step of RIE, with the result that an aluminum wiring 9 is brought into electric contact with the silicon substrate 1. In other words, short-circuiting takes place.

SUMMARY OF THE INVENTION

An object of the present invention is to provide a semiconductor device having multi-wiring layers formed on a semiconductor substrate, which permits miniaturizing the device and, thus, improving the degree of integration without bringing about short-circuiting between the wiring layers and the semiconductor substrate.

According to the present invention, there is provided a semiconductor device, comprising a substrate, a first insulation layer formed on the substrate, a first wiring layer formed on the first insulation layer, a second insulation layer formed on the first wiring layer and having a contact hole, said contact hole being provided with a portion passing through said first insulation layer and first wiring layer and reaching said substrate, and a third insulation layer formed on the substrate; which fills the portion of said contact hole.

An allowance is certainly provided in the step of forming the contact hole in view of the deviation in the mask alignment. In the present invention, however, it is possible to minimize the allowance, leading to a miniaturization and an improved degree of integration of the device. To be more specific, deviation of the contact hole may possibly cause the field oxide layer to be etched to form a small groove in the field oxide layer such that the groove extends to reach the substrate. In the present invention, however, the groove, even if formed, is filled with the third insulation layer. It follows that a second wiring layer filling the contact hole is prevented from contacting the substrate, even if the contact hole is positioned beyond the edge of the first wiring layer. The particular construction permits minimizing the allowance of the contact hole, leading to miniaturization and improved integration degree of the semiconductor device.

DETAILED DESCRIPTION OF THE PREFERRED EMBODIMENTS

Figure 1A:
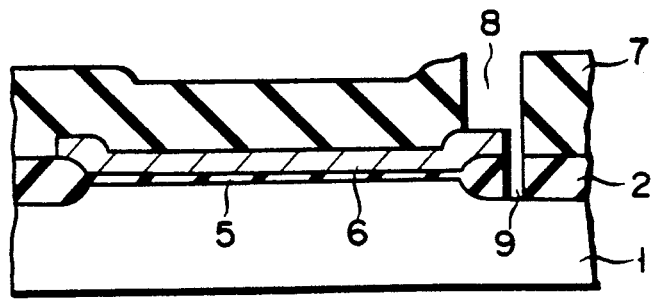
FIGS. 1A to 1C are cross sectional views collectively showing the process of manufacturing a semiconductor device according to one embodiment of the present invention.
Figure 1B:
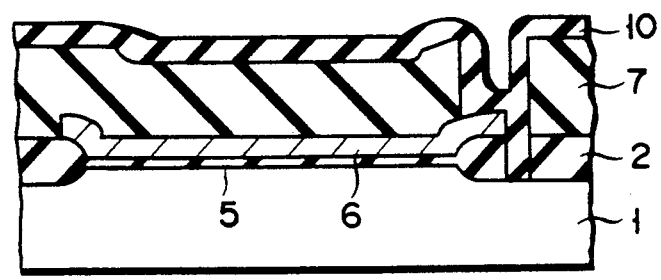
Figure 1C:
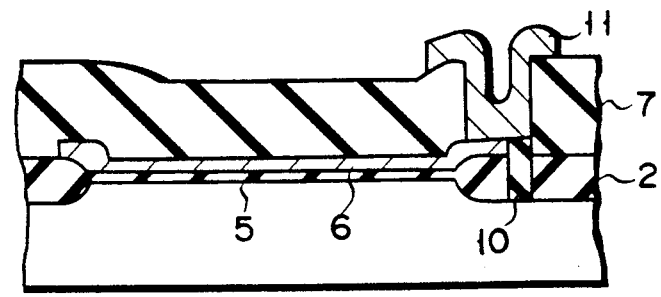
Figure 3A:
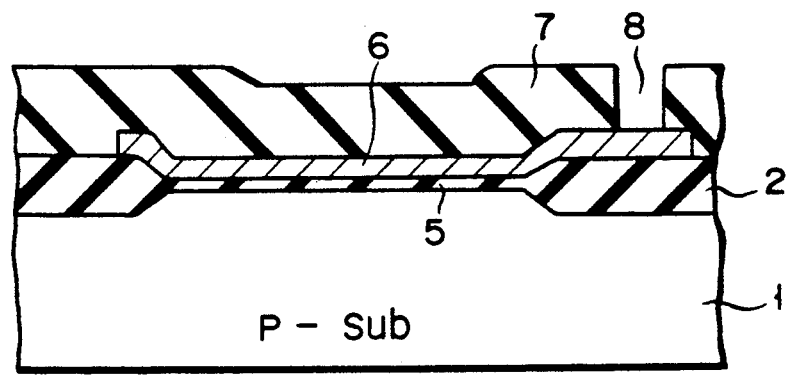
FIG. 3A is a cross sectional view showing a semiconductor device produced by a conventional method.
Figure 3B:
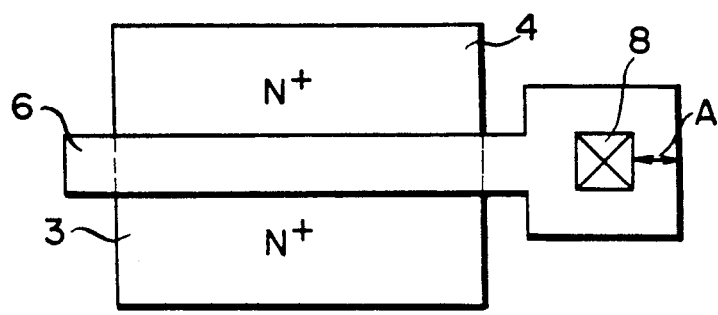
FIG. 3B is a plan view showing a semiconductor device produced by a conventional method.
Figure 4:
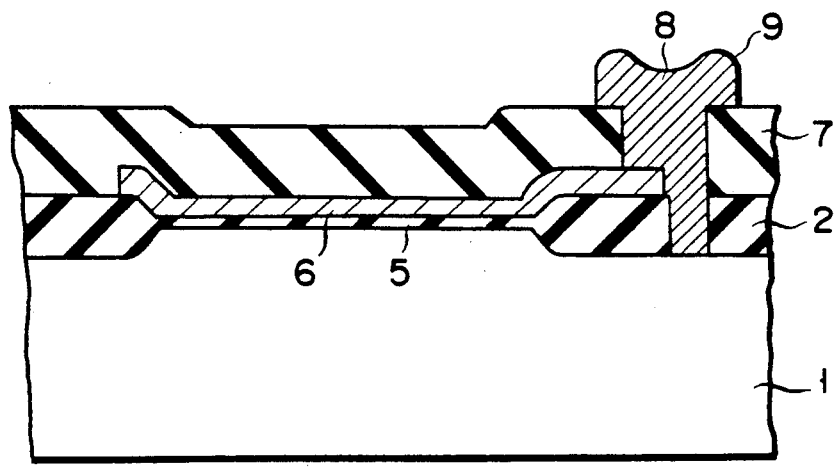
FIG. 4 is a cross sectional view showing a defect accompanying a semiconductor device produced by a conventional method.

A semiconductor device according to one embodiment of the present invention is manufactured as shown in FIGS. 1A to 1C. The device shown in these drawings corresponds to the conventional device shown in FIG. 3 and, thus, the reference numerals common with these drawings denote the same members of the device.

Figure 2:
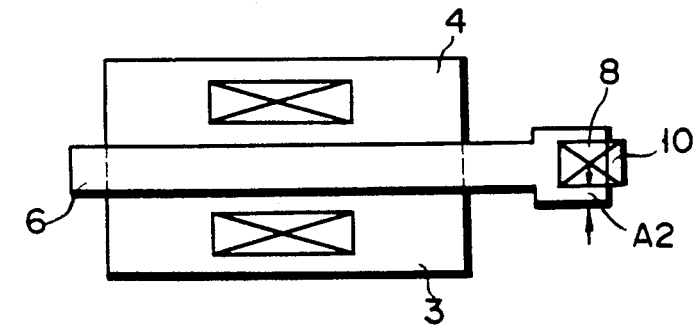
FIG. 2 is a plan view showing a portion of the device shown in FIG. 1 relevant to the invention.

As shown in FIG. 1A, a field oxide layer 2 is formed on a P-type silicon substrate 1. Then, an $N^+$-type source region 3, an $N^+$-type drain region 4, and a gate oxide layer 5 are formed as shown in FIG. 2, which is a plan view, followed by forming a gate electrode 6 formed of polycrystalline silicon layer doped with an impurity. Further, an interlayer insulation layer 7 is deposited on the gate electrode 6, followed by forming a contact hole 8 in the insulation layer 7 by an anisotropic etching using a resist pattern. In forming the contact hole 8, an allowance A2 in the width of the contact portion with the gate electrode 6 is set small for miniaturizing the semiconductor device. Thus, if a deviation takes place in the mask alignment, the field insulation layer 2 is also etched near the periphery of the gate electrode 6 so as to form a groove 9 extending downward to reach the substrate 1.

In the next step, an insulation layer 10, e.g., a silicon nitride layer or a silicon dioxide layer, is deposited on the entire surface in a thickness of 1500 by means of low pressure CVD, as shown in FIG. 1B. If the thickness of the insulation layer 10 is at least half the width of the groove 9, the groove 9 is completely filled with the insulation layer 10. The insulation layer 10 is then removed by an isotropic etching, as shown in FIG. 1C. If the depth of the groove 9 is markedly larger than the width thereof, the insulation layer 10 is left unremoved selectively within the groove 9 in this etching step. Finally, an aluminum layer is formed on the entire surface, followed by patterning the aluminum layer so as to form an aluminum wiring 11.

In the embodiment described above, the groove 9 is filled with the insulation layer 10, e.g., a silicon nitride layer, with the result that the short-circuit between the aluminum wiring 11 and the silicon substrate 1 can be prevented. In addition, the allowance A2 in the contact portion of the gate wiring 6 can be diminished, leading to miniaturization and high integration degree of the semiconductor device.

The technical idea of the present invention can be applied not only to the semiconductor device described above but also to any type of devices requiring miniaturization and also requiring a measure for preventing short-circuit between the conductor within the contact hole and the semiconductor substrate.

What is claimed is:

1. A semiconductor structure providing for connection between wiring layers, comprising:
   a semiconductor substrate;
   a first insulating layer formed on said substrate;
   a first wiring layer formed on said first insulating layer;
   a second insulating layer formed on said first wiring layer and having a contact hole, said contact hole being provided with a hole portion formed directly under a bottom of said contact hole, said hole portion passing through said first insulating layer and said first wiring layer and reaching said substrate;
   means filling said hole portion of said contact hole for preventing said first wiring layer from contacting said semiconductor substrate; and
   a second wiring layer filling said contact hole and formed on said second insulating layer and said means filling said hole portion, and connected to said first wiring layer;
   wherein said contact hole serves solely to connect said first wiring layer to said second wiring layer and said means filling said hole portion of said contact hole prevents short-circuiting of the device.

2. The semiconductor device according to claim 1, further comprising a second wiring layer buried in the contact hole in contact with the first wiring layer.

3. The semiconductor device according to claim 1, further comprising a field oxide layer interposed between the substrate and the second insulating layer.

4. The semiconductor device according to claim 1, wherein the substrate is of P-type.

5. The semiconductor device according to claim 1, further comprising a source region, a drain region and a gate region formed on the substrate.

6. The semiconductor device according to claim 1, wherein the first wiring layer acts as a gate electrode positioned between source region and drain. regions.

7. The semiconductor device according to claim 1, wherein the first wiring layer is formed by anisotropic etching using a resist pattern.

8. The semiconductor device according to claim 1, wherein the contact hole is formed by anisotropic etching using a resist pattern.

9. The semiconductor device according to claim 1, wherein the third insulating layer is a silicon nitride layer formed by low pressure CVD.

10. The semiconductor device according to claim 1, wherein the third insulating layer has a thickness not less than half the width of said hole portion of said contact hole constituting a groove formed in the second insulating layer.

* * * * *